United States Patent [19]

Taguchi et al.

[11] Patent Number: 4,803,530
[45] Date of Patent: Feb. 7, 1989

[54] SEMICONDUCTOR INTEGRATED CIRCUIT FORMED ON AN INSULATOR SUBSTRATE

[76] Inventors: Shinji Taguchi; Hiroyuki Tango, both of c/o Toshiba Research & Development Center, Toshiba-cho No. 1, Komukai, Saiwai-ku, Kawasaki-shi, Kanagawa-ken, Japan

[21] Appl. No.: 830,868

[22] Filed: Feb. 19, 1986

Related U.S. Application Data

[63] Continuation-in-part of Ser. No. 615,703, May 29, 1984, abandoned, which is a continuation of Ser. No. 934,493, Aug. 17, 1978, abandoned.

[30] Foreign Application Priority Data

Aug. 22, 1977 [JP] Japan ................................. 52-99549

[51] Int. Cl.⁴ ...................... H01L 27/12; H01L 29/78
[52] U.S. Cl. .................................. 357/23.7; 357/23.12; 357/28; 357/41

[58] Field of Search ............... 357/23.7, 23.12, 41, 357/28; 307/450

[56] References Cited

U.S. PATENT DOCUMENTS

| | | | |
|---|---|---|---|
| 3,700,981 | 10/1972 | Masuhara et al. | 307/450 |
| 3,958,266 | 5/1976 | Athanas | 357/23.7 |
| 4,072,868 | 2/1978 | De La Moneda et al. | 357/23.12 |
| 4,395,726 | 7/1983 | Maeguchi | 357/23.7 |

Primary Examiner—William D. Larkins
Attorney, Agent, or Firm—Young & Thompson

[57] ABSTRACT

A semiconductor integrated circuit formed on an insulator substrate and comprising a drive transistor and a load transistor, in which a threshold voltage of the load transistor is set in the range of $-2.8V$ to $-1.0V$ so as to ensure stable operation without temperature dependency with respect to working speed and power consumption of the circuit.

1 Claim, 4 Drawing Sheets

Enhancement type Transistor  Depletion type Transistor

Enhancement type Transistor    Depletion type Transistor

SEMICONDUCTOR INTEGRATED CIRCUIT FORMED ON AN INSULATOR SUBSTRATE

The present application is a continuation-in-part of Ser. No. 615,703 filed May 29, 1984, now abandoned, which was a continuation of Ser. No. 934,493 filed Aug. 17, 1978, now abandoned.

BACKGROUND OF THE INVENTION

This invention relates to a semiconductor integrated circuit formed on an insulator substrate, in which the working characteristics or working speed of the integrated circuit and/or the large scale integration (LSI) has minimal temperature dependency, without resort to separately added temperature compensation circuits. It relates more particularly to a method and to a semiconductor integrated circuit formed on an insulator substrate in which the working speed or the propagation delay time and the power consumption are kept substantially constant independent of temperature variations by providing a threshold voltage for the load transistor in the integrated circuit in the range of about $-2.8V$ to $-1.0V$.

An integrated circuit of the type which is formed on a substrate of bulk silicon or bulk germanium is well known. However, an integrated circuit of such type has the disadvantage that the working speed is sharply reduced at elevated temperature. Reduced working speed is the consequence of diminution of carrier mobility which occurs with increase in temperature. For example, in an integrated circuit forming an inverter circuit comprising an enhancement and depletion type integrated circuit (hereinafter referred to as the E/D type IC) in which a drive transistor is of an enhancement type while a load transistor is of a depletion type, higher working speed and larger output than presently available are required for many applications. Carrier mobility of the load transistor is of vital importance in achieving this end, although carrier mobility of the drive transistor may be disregarded.

Generally, the working characteristics of the E/D type IC formed on the bulk substrate relative to temperature is represented by the following equation:

$$\left(\frac{\partial t_{pd}}{\partial T}\right)/t_{pd} = -2\left(\frac{\partial V_{TD}}{\partial T}\right)/V_{TD} - \left(\frac{\partial \mu_{eff}}{\partial T}\right)/\mu_{eff} \quad (1)$$

wherein T stands for time, $t_{pd}$ stands for working speed or propagation delay time, $V_{TD}$ is a threshold voltage of the load transistor and $\mu_{eff}$ denotes effective mobility in equation (1). To reduce temperature dependency of the propagation delay time tpd to zero $$-2\left(\frac{\partial V_{TD}}{\partial T}\right)/V_{TD} = \left(\frac{\partial \mu_{eff}}{\partial T}\right)/\mu_{eff} \quad (2)$$

In the E/D type IC formed on a bulk substrate, the temperature dependency of the effective mobility $\mu_{eff}$ of the carrier is quite high as hereinbefore noted. Hence, temperature compensation effect will not be obtained by suitable selection of the threshold voltage $V_{TD}$ in relation to the effective mobility $\mu_{eff}$ because as will be apparent from equation (2), the desired temperature compensation effect cannot be obtained in such E/D type integrated circuit unless the threshold voltage is set at values which are difficult if not impossible to attain for the integrated circuit.

The temperature characteristics of MOS transistors have been analyzed by O. Leistiko et al. ["Electron and Hole Mobilities in Inversion Layers on Thermally Oxidized Silicon Surfaces", IEEE Trans ED, ED-12 Vol., 5, p 248 (May, 1965)]and L. Vadasz et al. ["Temperature Dependent of MOS Transistor Characteristics Below Saturation", IEEE Trans. ED, ED-13, Vol., 12, p 863 (Dec., 1966)]and it has been ascertained that the temperature dependency of carrier mobility and the temperature variation of Fermi level influence both the transfer conductance and the threshold voltage of the transistor as well as resultant saturation current thereof.

A typical method of forming a MOS transistor on the monocrystal insulator substrate of sapphire is disclosed in "N-N channel Si-Gate MOS Devices on Sapphire Substrate", Proceedings of the Sixth Conference on Solid State Devices, Tokyo, 1974 (Supplement to the Journal of the Japan Society of Applied Physics, Vol. 44, 1975, pp 225–231) Hiroyuki Tango, Jun Iwamura, Kenji Maeguchi and Mitsuo Isobe.

Further, the effect of temperature variations on the pulse characteristics of two kinds of inverters, namely (a) an inverter of basic digital MOS-IC form, i.e. an inverter with a load transistor of the drain-earthed MOS type in which the gate and the drain are electrically connected, and (b) an inverter with a source-earthed load transistor has been reported by Y. Hayashi and Y. Tarui ["Temperature Characteristics of ED-MOS-IC", Meeting of Semiconductor and Transistor Group of Institute of Electronics and Communication Engineers of Japan, April SSD-71-4 (1971-04 in Japan)]. Particularly, this report refers to the temperature dependency of the propagation delay time of IC in which an MOS transistor, formed on a bulk silicon substrate, is used as a depletion type load transistor.

After extensive research and experiments on the temperature characteristics of an integrated circuit of the E/D type formed on an insulator substrate instead of on the bulk substrate of the prior art, we have ascertained that the temperature dependency of the delay time $t_{pd}$ or the working speed can readily be reduced to zero, this being impossible with an integrated circuit formed on a conventional bulk substrate for reasons aforementioned, i.e. the threshold voltage cannot be set to the very low values for such E/D type IC formed on a bulk substrate.

In general, we utilize sapphire, spinel, polycrystal silicon (poly Si), glass, quartz and crystal as insulator substrates in a semiconductor integrated circuit, and preferably we use a SOS device comprising a monocrystal of silicon grown by the CVD technique (chemical vapor deposition) on a substrate of sapphire. For purpose of disclosure, the invention will be described with respect to an SOS device although, as will be apparent from the disclosure to follow the invention is not thus restricted.

Measurements of the temperature dependency of the threshold voltage $V_{TD}$ and of the effective mobility $\mu_{eff}$ of the depletion type transistors of the preferred SOS device within the range of $-60°$ to $150°$ C. and measurements of the temperature dependency of propagation delay time $t_{pd}$ in the working speed and comparing said measurements with corresponding calculated values shows that the delay time $t_{pd}$ scarcely varies with variation in the temperature in the range of −2.8V to −1.0V.

Moreover, measurement of the temperature dependency on mean power consumption $P_d$ of the depletion type transistors comprising the SOS device of the invention, has shown negligible temperature dependency within the recited threshold voltage range.

SUMMARY OF THE INVENTION

The invention generally provides a semiconductor integrated circuit formed on an insulator substrate and comprises a drive transistor and a load transistor, the threshold voltage of which is set in the range of −2.8V to −1.0V to ensure stable operation of this circuit by making it non-temperature dependent with respect to working speed and power consumption.

More specifically, the invention provides a semiconductor integrated circuit formed on an insulator substrate and comprises an enhancement-depletion type semiconductor integrated circuit formed on an insulator substrate in which the drive transistor is of an enhancement type and the load transistor is of a depletion type, the threshold voltage for the depletion type transistor being set within the range of −2.8V to −1.0V, preferably between −2.1V to −1.7V.

The insulated substrate according to the invention is preferably of the SOS (silicon on sapphire) type.

Objects and advantages of the invention will be apparent from the following description in connection with the accompanying drawings.

DESCRIPTION OF THE PREFERRED EMBODIMENTS

The detailed description which follows describes semiconductor integrated circuits formed on an insulator substrate, according to the present invention, and compares them with semiconductor integrated circuits formed on a bulk substrate, according to prior art practices.

In accordance with the invention, we prepared an SOS substrate with a silicon film having a thickness of 0.7 μm, and gate oxide films with an oxide film thickness $d_{ox}$ of 770 Å were developed on the silicon film of the SOS substrate so that N-channel transistors with an effective channel length $L_{eff}$ of 2.67 μm and an effective channel width $W_{eff}$ of 6.22 μm were formed on the silicon film.

We then prepared, in accordance with the prior art, a bulk silicon substrate having a resistivity of 20Ω·cm, and gate oxide films with an oxide film thickness $d_{ox}$ of 800 Å were developed on the silicon film of the bulk silicon substrate so that N-channel transistors with a channel length L of 4 μm and a channel width of 6 μm were formed on the silicon film.

EXPERIMENT (1)

Temperature Characteristics of the Threshold Voltage $V_{TD}$

The temperature characteristics of the threshold voltage $V_{TD}$ was measured in the range of −60° to 150° C., using the MOS device formed on the SOS substrate of the invention and setting the drain voltage $V_D$ at 0.05V.

Figure 1:
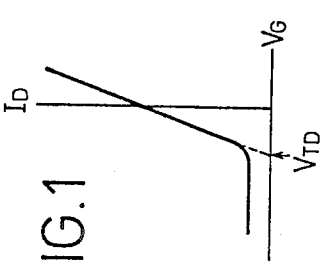
FIG. 1 is a plot of gate voltages $V_G$ vs. drain current $I_D$.
Figure 1A:
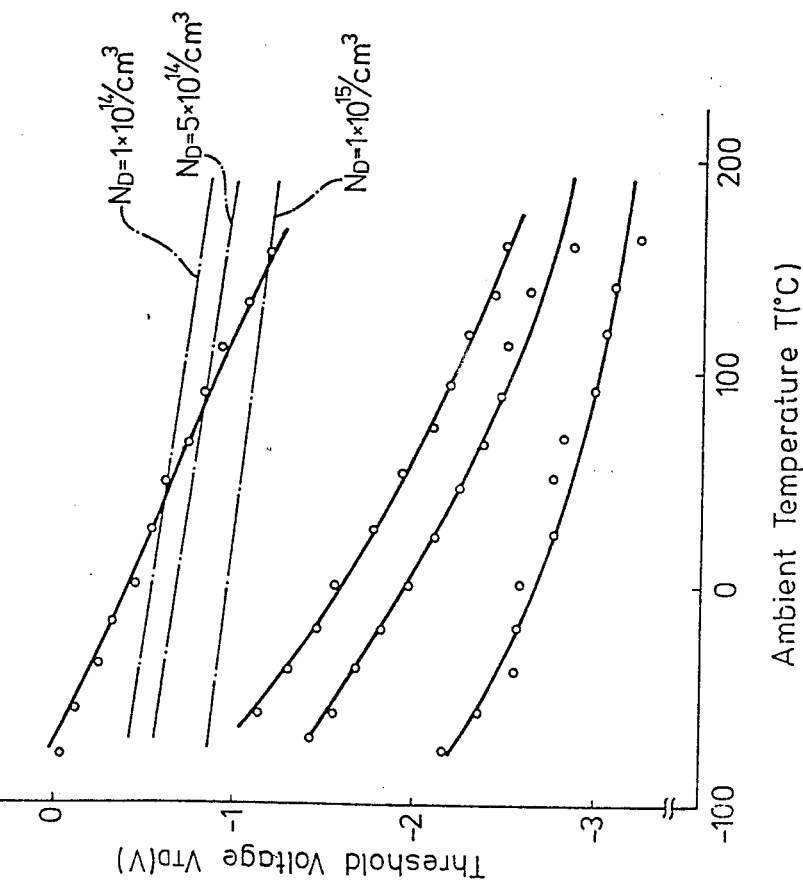
FIG. 1A is a temperature characteristic curve diagram of the threshold voltage $V_{TD}$ of an MOS device formed on the SOS substrate embodying the present invention.

The measurements are shown in FIG. 1A. Measurement was performed on samples of four devices each having different donor concentration $N_D$ in the Si film. The threshold voltage $V_{TD}$ is defined, with reference to FIG. 1, as the intersection point of the extension of the straight line portion of the characteristic curve of the plot of gate voltage $V_G$ versus the drain current $I_D$ and the axis at which ID=0.

In an MOS device in which the threshold voltage $V_{TD}$ is relatively less negative and donor concentration of Si film is low and, as the gate voltage is increased in the negative direction, the depletion layer from the gate surface reaches the interface of Si - Sapphire. The gate voltage when this occurs is defined as the threshold voltage. Assuming that the impurity concentration in the semiconductor film is homogeneous and only donor impurities are included, the threshold voltage can be defined as a depletion layer approximation by the following equation:

$$V_{TD} = -\frac{E_g}{2q} - \phi_f - \frac{Q_{ss}}{C_{ox}} - \frac{qN_D X_{Si}}{C_{ox}} - \frac{qN_D X_{Si}^2}{2\epsilon_0 \epsilon_{Si}} \quad (3)$$

wherein
  $C_{ox} = \epsilon_0 \epsilon_{SiO2}/d_{ox}$
  $E_g$: band gap width of silicon
  q: absolute value of the charge of an electron
  $\phi_f$: Fermi potential
  $Q_{ss}$: surface charge
  $N_D$: impurity concentration in the region of the channel (donor concentration in Si film)
  $X_{Si}$: film thickness of Si
  $d_{ox}$: gate oxide film thickness
  $\epsilon_0 \epsilon_{SiO2}$: dielectric constant of oxide film
  $\epsilon_0 \epsilon_{Si}$: dielectric constant of Si threshold voltage $V_{TD}$ having different donor concentration $N_D$ using the foregoing equation (3) and assuming that Fermi potential depends on temperature and that Si band gap width dependency on temperature is negligible compared to that of Fermi potential, the characteristic curves shown in dot-dash lines in FIG. 1A may be obtained for different parameters of the impurity concentration $N_D$.

From FIG. 1 it will be evident that the variation rate of $V_{TD}$ to temperature is a function of the threshold voltage. We have determined, for example, that the variation rate of the threshold voltage $V_{TD}$ to temperature will be $-5.1$ mV/° C. under room temperature when the threshold voltage is 0.54V. It should be understood that the variation rate of $V_{TD}$ to temperature is reduced when $V_{TD}$ becomes more negative.

The larger variation rate of the experimentally measured values of the variation rate of the threshold voltage $V_{TD}$ relative to temperature when compared with the calculated values, may be accounted for by the temperature dependency of surface charge $Q_{ss}$.

For comparison, the temperature characteristics of the threshold voltage $V_{TD}$ of the MOS devices formed on the bulk silicon substrate of the prior art was measured in the temperature range of $-60°$ C. to 150° C., setting the drain voltage $V_D$ to 0.05V. The results of these measurement are shown in FIG. 2 and were performed using, as samples, four devices each having different donor concentration in the Si film.

The MOS devices formed on a bulk silicon substrate has a lower donor concentration $N_D$ in Si film and, as the gate voltage $V_G$ is increased in negative direction, the depletion layer from the gate surface reaches to the p - n junction of the substrate. The gate voltage in this case is defined as the threshold voltage. Hence, the temperature characteristics of the threshold voltage $V_{TD}$ in the MOS devices formed on a bulk Si substrate can also be calculated using the equation (3), in this case, however, $X_{Si}$ being the thickness of the n-layer in the channel region. The calculated results are shown by the dash lines and the measured results by the solid lines in FIG. 2.

Figure 2:
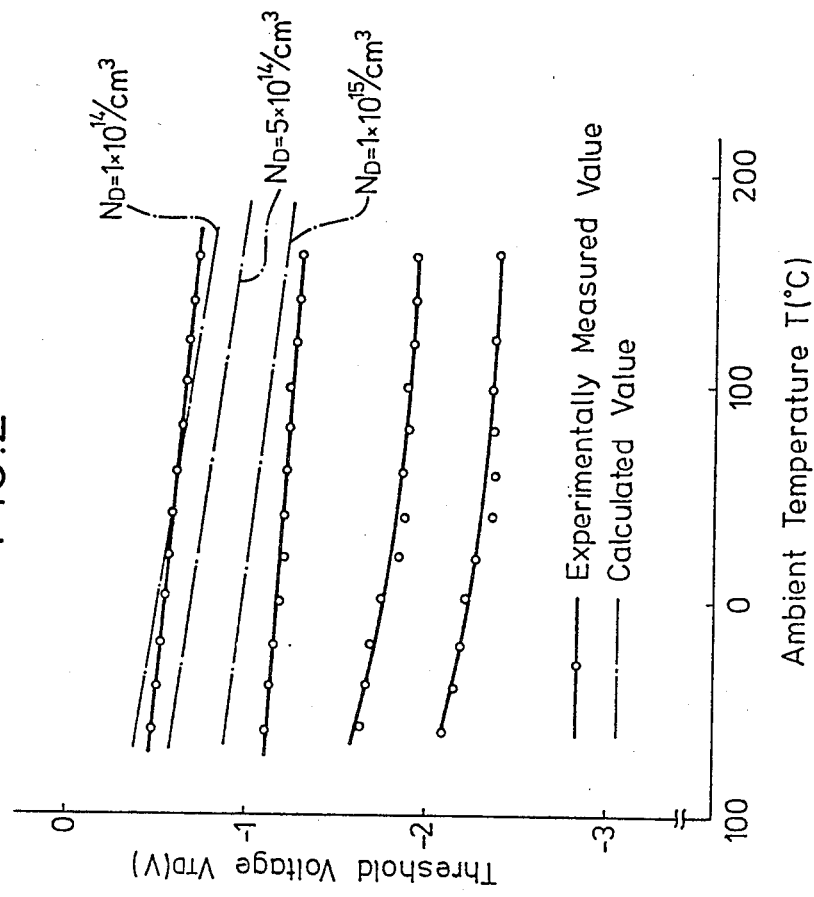
FIG. 2 is a temperature characteristic curve diagram of the threshold voltage $V_{TD}$ of an MOS device formed on the bulk substrate.

Using the data in FIG. 2, we have determined that the variation rate of the threshold voltage to the temperature in the MOS devices formed on a bulk Si substrate is $-1.0$ mV/° C. when the threshold voltage $V_{TD} = -0.62$V under room temperature. This value is about one-fifth of that of the MOS devices formed on the SOS substrate.

As to the samples used in Experiment (1)

(a) Four devices according to the present invention

In FIG. 1A, the values of donor concentration $N_D$ (shown in four solid lines in order from above) are as follows:

$N_D = 2 \times 10^{13}/\text{cm}^3$ $N_D = 2 \times 10^{15}/\text{cm}^3$ $N_D = 2.5 \times 10^{15}/\text{cm}^3$ $N_D = 3.6 \times 10^{15}/\text{cm}^3$ In FIG. 2 the values of donor concentration $N_D$ (shown in four solid lines in order from above) are as follows:

$N_D = 2 \times 10^{13}/\text{cm}^3$ $N_D = 2 \times 10^{15}/\text{cm}^3$ $N_D = 2.5 \times 10^{15}/\text{cm}^3$ $N_D = 3.6 \times 10^{15}/\text{cm}^3$ which values are the same as shown in FIG. 1A.

(c) In the Experiment (1), the value of surface charge $Q_{ss}$ is nearly constant for the devices of the present invention and the prior art if the temperature is set constant, for $$Q_{ss} \approx 8 \times 10^{-9} \text{ coulomb/cm}^2 \cdot \text{eV}$$

in the room temperature (about 20° C.). This value of $Q_{ss}$, therefore, may be applied to the solid lines in FIGS. 1A and 2.

From the above data, the value of threshold voltage $V_{TD}$, for example for the second solid line from above in FIG. 1A, may be calculated, in accordance with the equation (3) as shown on page 8, as follows:

$$V_{TD} = -\frac{E_g}{2q} - \phi_f - \frac{Q_{ss}}{C_{ox}} - \frac{qN_D X_{Si}}{C_{ox}} - \frac{qN_D X_{Si}^2}{2\epsilon_0 \epsilon_{Si}} \quad (3)$$

wherein
Chd ox $= \epsilon_0 \epsilon_{SiO2}/d_{ox}$ $$\phi_f = -\frac{RT}{q} \ln \frac{N_p}{n_i}$$

$N_D = 2 \times 10^{15}/\text{cm}^3$
$d_{ox} = 770$ Å $= 770 \times 10^{-8}$ cm
$X_{Si} = 0.7$ μm
$Q_{ss} = q$   $N_{ss} = 1.6 \times 10^{-19} \times 5 \times 10^{10} = 8 \times 10^{-9}$ coulomb/cm²·eV
$R/q - 8.62 \times 10^{-5}$ eV/° K.
$T = 300$ ° K.
$n_i = 1.45 \times 10^{10}/\text{cm}^3$ (at 300° K.)
$\epsilon_0 \epsilon_{SiO2} = 8.86 \times 10^{-14} \times 3.9 = 3.455 \times 10^{-13}$ F/cm
$\epsilon_0 \epsilon_{Si} = 8.86 \times 10^{-14} \times 11.1 = 9.83 \times 10^{-13}$ F/cm
$E_g/q = 1.11$ eV,
then $$\therefore C_{ox} = 4.49 \times 10^{-18} \text{ F/cm}^2$$

$$\therefore \phi_f = -8.62 \times 10^{-5} \times 300 \times \ln(2 \times 10^{15}/1.45 \times 10^{10})$$
$$= -0.306 \text{ V}.$$

Therefore, $$V_{TD} = -\frac{1.11}{2} - (-0.306) - \frac{8 \times 10^{-9}}{4.49 \times 10^{-8}} -$$

$$\frac{1.6 \times 10^{-19} \times 2 \times 10^{15} \times 0.7 \times 10^{-4}}{4.49 \times 10^{-8}} -$$

$$\frac{1.6 \times 10^{-19} \times 2 \times 10^{15} \times (0.7 \times 10^{-4})^2}{2 \times 9.83 \times 10^{-13}} = -1.72 \text{ V}$$

It will be understood that the above result of calculation coincides well with an actual measurement (see FIG. 1A).

EXPERIMENT (2)

Temperature Characteristics of Effective Mobility $\mu_{eff}$

In this experiment, the MOS transistors with a channel length L of 100 μm and a channel width W of 150 μm were prepared on the SOS substrate, in accordance with the invention, and the temperature characteristics of the effective mobility $\mu_{eff}$ were measured setting the drain voltage $V_D$ to 0.05V and the gate voltage $V_G$ to 0V and using the threshold voltage $V_{TD}$ as parameters. The measured results are shown by solid lines in FIG. 3.

Similarly, MOS transistors with a gate length L of 100 μm and a channel width W of 105 μm were prepared but on a bulk Si substrate in accordance with the prior art and the temperature characteristics of the effective mobility eff were measured when a drain voltage $V_D=0.05V$ and a gate voltage $V_G=OV$ as a function of threshold voltage $V_{TD}$ parameters. The measured results are shown by dash lines in FIG. 3.

The Table below shows the temperature characteristics of the effective mobility $\mu_{eff}$ of the MOS devices formed on SOS substrate and of the MOS devices formed on the bulk substrate, the temperature characteristics at $-60°$ C., $20°$ C. and $100°$ C. for both of these devices having been determined during measurements made in accordance with Experiment (2).

| Temperature T | Effective Mobility $\mu_{eff}$ (MOS device on SOS substrate) ($V_{TD} = -2.14$ V) | Effective Mobility $\mu_{eff}$ (MOS device on bulk SI substrate) ($V_{TD} = -2.20$ V) |
| --- | --- | --- |
| $-60°$ C. | 740 cm$^2$/V.sec. | 1500 cm$^2$/V.sec. |
| $20°$ C. | 540 cm$^2$/V.sec. | 1040 cm$^2$/V.sec. |
| $100°$ C. | 400 cm$^2$/V.sec. | 580 cm$^2$/V.sec. |

The temperature dependency of the effective mobility $\mu_{eff}$ is represented generally in the formula:

$$\mu_{eff} \propto T^{-n} \quad (4)$$

wherein, in the temperature range of $0°$ C. to $150°$ C., $n=1.5$ for MOS devices formed on the SOS substrate and $n=1.9$ for the MOS devices formed on the bulk Si substrate. The formula confirms that the MOS device formed on the bulk Si substrate has a larger temperature dependency than the MOS device formed on the SOS substrate, which might be accounted for by the fact that, in the case of MOS device on the bulk Si substrate, the scattering of the carriers is mainly caused by the lattice scattering caused by phonons but, in the case of the MOS device formed on the SOS substrate, the defects of a number of $10^9$ to $10^{10}$/cm$^2$ existing in the Si film as well as phonons are effective to reduce the temperature dependency.

The following conclusions may be reached from Experiments (1) and (2). The MOS device formed on the SOS substrate has (a) a larger variation rate of threshold voltage $V_{TD}$ to temperature, the variation rate being reduced as $V_{TD}$ becomes relatively more negative, and (b) smaller variation rate of effective mobility $\mu_{eff}$ to temperature compared to the MOS device formed on the bulk Si substrate which has a smaller variation rate of the threshold voltage $V_{TD}$ to temperature and larger variation rate of the effective mobility $\mu_{eff}$ to temperature within the same temperature range of measurement; i.e. $-60°$ C. to $150°$ C.

EXPERIMENT (3)

Temperature Characteristics of Delay Time $t_{pd}$ Working Speed

The temperature characteristics of the propagation delay time $t_{pd}$ were measured using the threshold voltage as parameters in samples of E/D type IC each comprising a load transistor of the MOS device in accordance with the invention and a drive transistor with an effective channel length $L_{eff}$ of 2.44 $\mu$m and an effective channel width $W_{eff}$ of 8.22 $\mu$m and formed in the SOS substrate of the invention. The measured results are shown by solid lines in FIG. 4.

Similarly, the temperature characteristics of the delay time $t_{pd}$ in the working speed were measured using the threshold voltage as parameters in samples of E/D type IC each comprising the MOS device formed on the bulk silicon of the prior art. The measured results are shown by broken lines in FIG. 4.

Figures 3, 4:
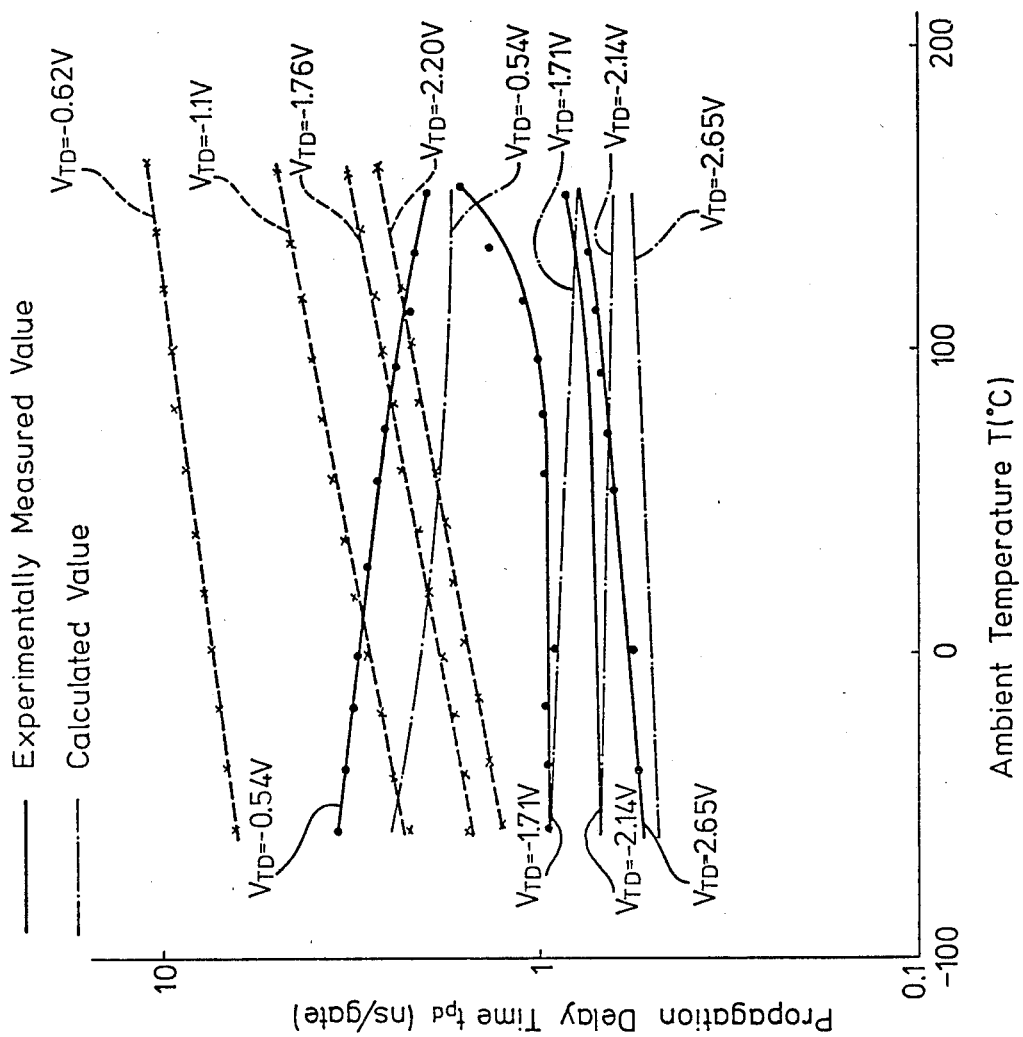
FIG. 3 is a characteristic curve diagram representing comparative temperature characteristics of the effective mobilities $\mu_{eff}$ of the MOS device formed on the SOS substrate according to the present invention and the MOS device formed on the bulk substrate.
FIG. 4 is a characteristic curve diagram representing comparative temperature characteristics of the delay time $t_{pd}$ in the working speed of the MOS device formed on the SOS substrate according to the present invention and the MOS device formed on the bulk substrate.

The temperature dependency of the threshold voltage $V_{TD}$ being predominant when the threshold value $V_{TD}$ is relatively less negative in the SOS substrate, the delay time $t_{pd}$ will normally decrease with decrease in temperature. However, by so reducing the variation rate of $V_{TD}$ to temperature that the temperature dependency of the effective mobility $\mu_{eff}$ becomes predominant when the threshold voltage is made relatively more negative, the delay time $t_{pd}$ can be made to increase with temperature. Thus as seen in FIG. 4, when the threshold voltage $V_{TD}$ is in the range of $-2.8V$ to $-1.0V$ the delay time $t_{pd}$ scarcely varies with temperature variation. This means that the larger variation rate of the threshold voltage $V_{TD}$ to the temperature (variation rate of $V_{TD}$ to temperature being reduced as the threshold voltage $V_{TD}$ becomes relatively more negative) and the smaller variation rate of the effective mobility $\mu_{eff}$ to temperature, in the integrated circuit formed on the SOS substrate, produce a temperature compensation effect which compensates for the temperature dependencies of the threshold voltage $V_{TD}$ and the effective mobility $\mu_{eff}$ when the threshold voltage $V_{TD}$ is in the range of $-2.8V$ to $-1.0V$, preferably in the range of $-2.1V$ to $-1.7V$. For example, in a sample with the threshold voltage $V_{TD}$ of $-2.14V$, the delay time $t_{pd}$ is 0.7 ns/gate at $-60°$ C. and 0.75 ns/gate at $60°$ C., which shows that the variation rate is 7% in this range.

In the integrated circuit formed on the bulk Si substrate, since the temperature dependency of the effective mobility $\mu_{eff}$ is predominant when the threshold voltage $V_{TD}$ is in the range of $-0.62V$ to $-2.2V$, the delay time $t_{pd}$ increases with the increase of the temperature. Therefore, in this case, it could be considered that there exists a temperature compensation effect of the threshold voltage $V_{TD}$ and the effective mobility $\mu_{eff}$ at least under a condition of the threshold voltage $V_{TD}-0.62V$, but it is, in general, very difficult or impossible to realize an integrated circuit in such a range. Further, in a sample with a threshold voltage $V_{TD}$ of $-2.2V$, the delay time $t_{pd}$ is 1.24 ns/gate at $-60°$ C. and 1.9 ns/gate at $60°$ C., which shows that the variation rate amounts to approximately 40% in this range.

Additionally, in case of an integrated circuit formed on the SOS substrate, a simulation of the temperature dependency of the delay time $t_{pd}$ in the previously mentioned equation (1) using the values of the threshold voltage $V_{TD}$ and effective mobility $\mu_{eff}$ at each temperature gives calculated curves shown by dash lines joining "X" markings in FIG. 4. The results show that the experimentally measured values fairly coincide with the calculated values.

EXPERIMENT (4)

Temperature Characteristics of Mean Power Consumption $P_d$

The temperature characteristics of the mean power consumption $P_d$ of an integrated circuit formed on a SOS substrate were measured using the threshold voltage $V_{TD}$ as parameters. The results are shown by solid lines in FIG. 5.

Similarly, the temperature characteristics of the mean power consumption $P_d$ of the integrated circuit formed on the bulk Si substrate were measured using the threshold voltage $V_{TD}$ as parameters. The results are shown by broken lines in FIG. 5.

Figure 5:
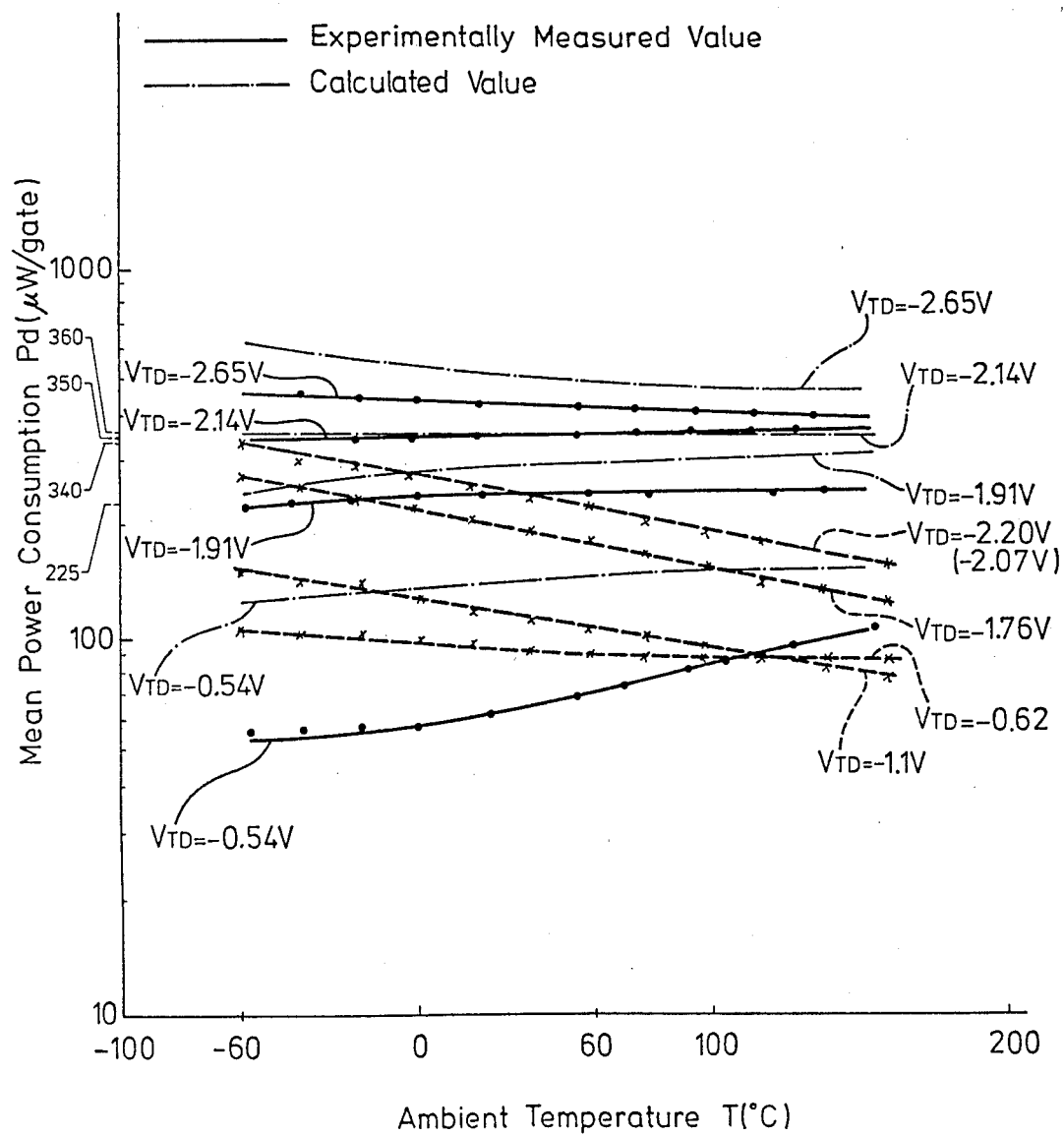
FIG. 5 is a characteristic curve diagram representing comparative temperature characteristics of the mean - power consumption $P_d$ of the MOS device on the SOS substrate according to the present invention and the MOS device on the bulk substrate.

FIG. 5 shows that, in the integrated circuit formed on the SOS substrate, the mean power consumption $P_d$ increases with elevation of temperature when the threshold voltage $V_{TD}$ is relatively less negative and will decrease with increase of temperature when the threshold voltage $V_{TD}$ is relatively more negative. Therefore, in case that the threshold voltage $V_{TD}$ is −2.14V, the mean power consumption $P_d$ s 350 μW/gate at −60° C. and 360 μW/gate at 60° C., which shows approximately 3% variation rate.

Further, in the integrated circuit formed on the bulk Si substrate, since the temperature dependency of the effective mobility $\mu_{eff}$ becomes predominant in the range of −0.62V to −2.2V of the threshold voltage $V_{TD}$, the mean power consumption $P_d$ decreases with increase of the temperature. Hence, in case of a threshold voltage $V_{TD}$ of −2.2V, the mean power consumption $P_d$ is seen to be substantially higher at −60° C. than at 60° C., there being a variation rate of approximately 40% in this range compared with the 3% variation rate of mean power consumption.

Considering these results, it is advantageous to use MOS devices formed on an SOS substrate with larger mean power consumption and smaller variation rate to temperature for E/D type IC where large output is required.

Moreover, for an integrated circuit formed on an SOS substrate, power consumption can be determined using in formula (3) values of threshold voltage $V_{TD}$ and effective mobility $\mu_{eff}$ at each temperature, to provide the characteristic curves shown by dash lines joining "X" markings in FIG. 5. The results show that the experimentally measured values fairly coincide with the calculated values.

Figure 6:
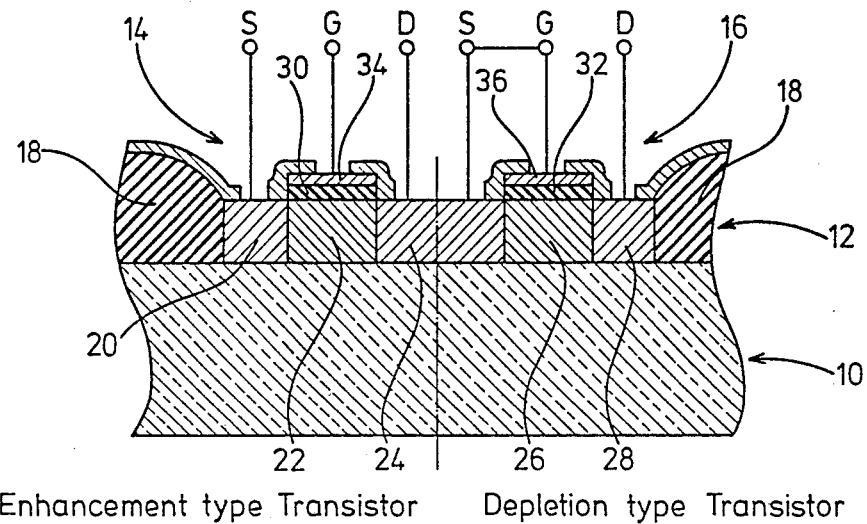
FIG. 6 is a longitudinally sectioned view of a semiconductor integrated circuit including an enhancement type transistor and a depletion type transistor formed on the same sapphire monocrystal substrate.

A semiconductor integrated circuit embodying the present invention is shown in FIG. 6 in which a silicon layer 12 is formed on a sapphire monocrystal substrate 10 and the silicon layer 12 is partially provided with an enhancement type transistor 14 (a drive transistor) as an insulator gate field effect element and a depletion type transistor 16 (a load transistor) in abutting relation and the remaining portion of the silicon layer 12 is oxidized to form an oxide film 18. Transistors formed in the silicon layer 12 contain channel zones 22 to 28 in which the channel zones 22 and 26 form gates G on which gate oxide films 30 and 32 are provided respectively. On the gate oxide films 30 and 32 are provided gate electrodes 34 and 36.

Figure 6A:
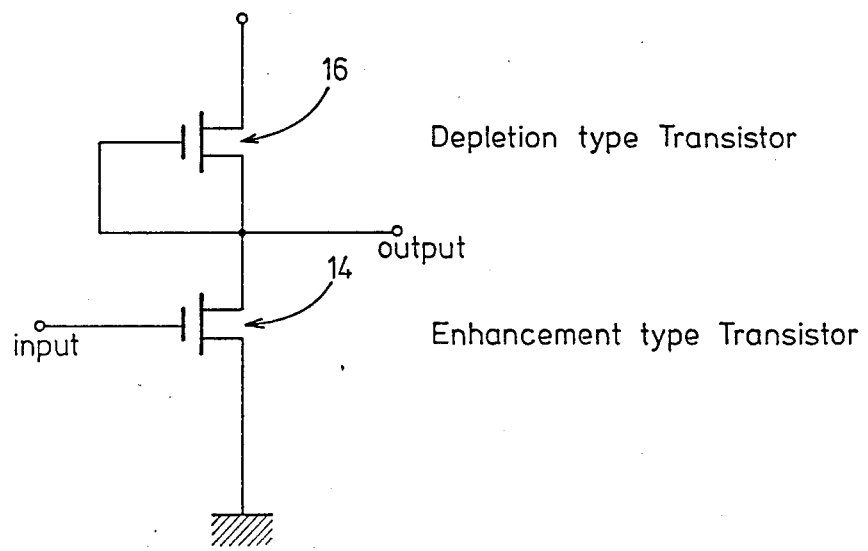
FIG. 6A is an equivalent circuit diagram of the semiconductor integrated circuit of FIG. 6.

In an inverter circuit arrangement as shown in FIG. 6A, when a threshold voltage $V_{TD}$ of the depletion type transistor 16 forming the load transistor is provided in the range of −2.8V to −1.0V preferably −2.1V to −1.7V, an integrated circuit may be provided which has no temperature dependency of delay time $t_{pd}$ and power consumption $P_d$. This has significant implications for the semiconductor industry.

What is claimed is:

1. A semiconductor integrated circuit with temperature compensation, comprising
   an enhancement-depletion semiconductor integrated circuit containing a silicon on sapphire substrate including a drive transistor of an enhancement type and a load transistor of a depletion type,
   said depletion type load transistor including a channel region having a layer of insulator material thereon, thereby to define an insulated gate depletion mode transistor,
   said depletion mode channel region having a donor concentration $N_D$ in the range of $2 \times 10^{13}$–$3.6 \times 10^{15}/cm^3$ and said depletion mode gate insulator having a surface charge $Q_{ss}$ that has a substantially constant value of about $8 \times 10^{-9}$ coulomb/$cm^2 \cdot eV$ at a temperature of about 20° C.,
   said depletion type load transistor having a threshold voltage between −2.1V and −1.7V when the ambient temperature of said circuit is in the range of −60° C. to 60° C., and
   said circuit having a variation rate of delay time $t_{pd}$ and power consumption $P_d$ at a substantially constant value within about 10%, thereby significantly reducing temperature dependency of the delay time and power consumption.

* * * * *